United States Patent [19]
Yonezawa

[11] Patent Number: 4,899,572
[45] Date of Patent: Feb. 13, 1990

[54] PNEUMATIC-HYDRAULIC BOOSTER TYPE DRIVING DEVICE FOR THE CUSHION-KNOCKOUT MECHANISM ASSOCIATED WITH THE SLIDE OF A PRESS-MACHINE

[75] Inventor: Keitaro Yonezawa, Amagasakishi, Japan

[73] Assignee: Kabushiki Kaisha Kosmek, Hyogoken, Japan

[21] Appl. No.: 137,814

[22] Filed: Dec. 24, 1987

[30] Foreign Application Priority Data

Dec. 26, 1986 [JP] Japan ................... 61-314775

[51] Int. Cl.⁴ ............................................. B21J 9/18
[52] U.S. Cl. .................................. 72/453.13; 72/427; 72/344; 267/119; 267/130
[58] Field of Search .............. 72/453.13, 427, 344; 267/118, 119, 130, 137; 83/617, 639

[56] References Cited

U.S. PATENT DOCUMENTS 3,290,034 12/1966 Williamson ............... 72/453.13

FOREIGN PATENT DOCUMENTS

616266 7/1935 Fed. Rep. of Germany ...... 267/119
3230673 5/1983 Fed. Rep. of Germany ... 72/453.13
58-76348 5/1983 Japan .

Primary Examiner—David Jones
Attorney, Agent, or Firm—Lowe, Price, Leblanc, Becker & Shur

[57] ABSTRACT

A pneumatic-hydraulic booster type driving device for the cushion-knockout mechanism associated with the slide of a press-machine serves to stably hold down a work plate such as a printed board and the like while performing a cushion operation at the time of a pressing stroke and serves to knock out the work plate after the pressing stroke in the press-machine. In the driving device, a pneumatic-hydraulic booster is connected through a pressure oil supply and discharge means to a hydraulic actuation chamber of a cushion cylinder provided in the slide of the press-machine, and the pressure oil supply and discharge means comprises a valve chamber within a valve casing and a knockout actuator which is fixedly secured to the valve casing so as to perform the valve opening operation of the valve unit. The valve unit is adapted to push a single valve body toward the valve closing side by the resultant force obtained from a spring force of a valve closing spring and the pressure in the valve chamber and to push the valve body toward the valve opening side by a pressure in a back pressure cylinder, which is connected to the valve chamber so that the force which pushes the valve body toward the valve closing side is decreased by the back pressure applied to the valve body.

5 Claims, 5 Drawing Sheets

PNEUMATIC-HYDRAULIC BOOSTER TYPE DRIVING DEVICE FOR THE CUSHION-KNOCKOUT MECHANISM ASSOCIATED WITH THE SLIDE OF A PRESS-MACHINE

BACKGROUND OF THE INVENTION

1. Field of the Invention

The present invention relates to a device which performs by a pneumatic-hydraulic booster the supply and discharge of a pressure oil in a hydraulic actuation chamber for the cushion-knockout mechanism associated with the slide of a press-machine such as a mechanical press, an oil hydraulic press and the like, and particularly to a pneumatic-hydraulic booster type driving device which is utilized for holding down a work plate such as a printed board and the like under the cushion operation thereof at the time of pressing as well as for knocking out the work plate from punches after the pressing respectively by predetermined pressures in the hydraulic actuation chamber.

The basic construction of such a pneumatic-hydraulic booster type driving device will be described hereinafter.

Figure 7:
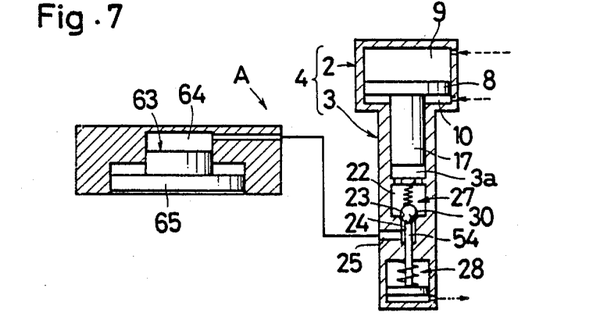
FIG. 7 is a schematic view of a cushion pre-pressurizing condition.
Figure 8:
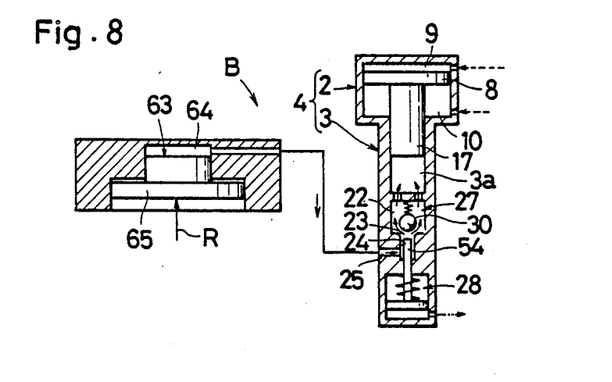
FIG. 8 is a schematic view of a cushion operating condition.
Figure 9:
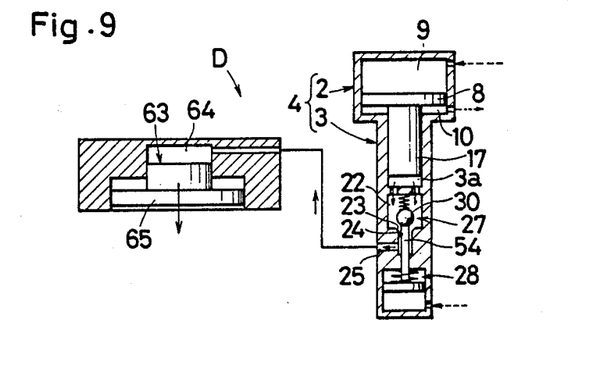
FIG. 9 is a schematic view of a knockout operating condition.

As shown in schematic views of FIGS. 7 through 9, a pneumatic-hydraulic booster 4 comprises a pneumatic cylinder 2 of a large diameter accommodating a piston 8 and an oil hydraulic cylinder 3 of a small diameter accommodating a plunger 17 connected thereto 8. The hydraulic cylinder 3 has a plunger chamber 3a which is adapted to be connected to a pressure oil inlet outlet/port 25 through a valve chamber 22, a valve seat 23 and an outlet chamber 24 arranged in order. The valve chamber 22 is provided with a valve unit 27 which is adapted to be opened in a state of a large flow area by a cushion actuating pressure in a cushion cylinder 63 of the press-machine so as to allow a high speed flow of a cushion pressure oil into the plunger chamber 3a through the pressure oil inlet outlet/port 25 and also to be opened in a state of a small flow area by a knockout actuator 28 so as to allow a flow out of a knockout pressure oil from the plunger chamber 3a to the pressure oil inlet outlet port 25.

Figures 2, 6:
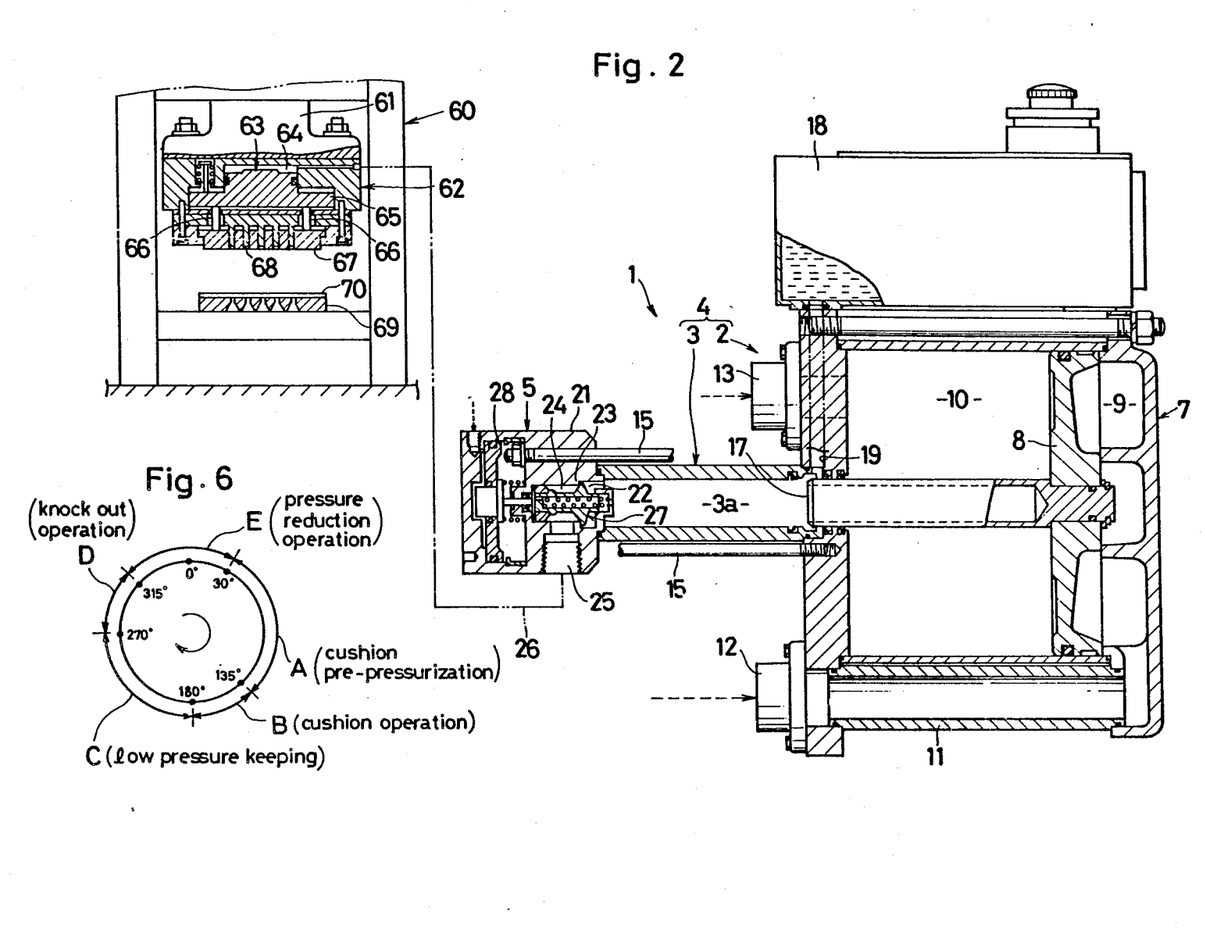
FIG. 2 is a vertical sectional view showing a pneumatic-hydraulic booster type driving device.
FIG. 6 is an explanatory view showing one cycle of a press work.

The basic construction is utilized, for example, as shown in FIGS. 2 and 6.

A cushion knockout mechanism 62 is mounted to a slide 61 of a press-machine 60 so as to be driven vertically integratedly with the slide 61. When a crankshaft goes through the rotational phase of, for example 30°–135° (a cushion pre-pressurization A) during the descendant actuation stroke, a work fixation plate 67 is lowered to a lower position under punches 68 through a knockout transmission plate 65 and knockout pins 66 by pre-pressurizing a cushion of pressurized oil in an oil hydraulic actuation chamber 64 of a cushion cylinder 63 by means of a pneumatic-hydraulic booster type driving device 1.

When the crankshaft goes through the rotational phase of 135°–180° (a cushion operation B), the work fixation plate 67 is adapted to abut to the work plate 70 placed on a lower die 69. Thereupon, the pressure oil in the oil hydraulic actuation chamber 64 serves a cushion operation so that the fixation plate 67 fixes the work plate 70 under a cushioned condition without causing any damage to the work plate 70. Then the punches 68 continuously move on towards the underside of the work fixation plate 67 so as to punch the work plate 70.

When the slide 61 reaches the bottom dead center thereof, the work plate 70 gets frictionally engaged with the punches 68 in then punched through condition.

When the crankshaft takes the rotational phase of 180°–270° (a low pressure keeping C) during the ascendant return stroke of the slide 61, the work plate 70 is raised by the punches 68 in a frictionally engaged condition.

When the crankshaft reaches the rotational phase of 270° (a knockout operation D), the work plate 70 is knocked out from the punches 68 through the work fixation plate 67 which is actuated through the knockout pins 66 by supplying a knockout pressure to the oil hydraulic actuation chamber 64 by means of the pneumatic-hydraulic booster type driving device 1.

After that, when the crankshaft goes through the rotational phase of 315°–30° (a pressure reduction operation E), the pressure in the oil hydraulic actuation chamber 64 is reduced to the cushion pre-pressurized oil pressure and one cycle of the punching work is completed.

During the operation of the cushion-knockout mechanism 62, the pneumatic-hydraulic booster type driving device 1 is adapted to operate in such a manner as shown in FIGS. 7 through 9.

In the cushion pre-pressurizing condition (A), as shown in FIG. 7, a supply of high pressure air is supplied to both the high pressure actuation chamber 9 and the low pressure actuation chamber 10 of the pneumatic cylinder 2 and the output portion 54 of the knockout actuator 28 caused to recede so that the pressures in the plunger chamber 3a and in the oil hydraulic actuation chamber 64 of the cushion cylinder 63 are kept at a low pressure. By this low cushion pre-pressurized pressure, the knockout transmission plate 65 is adapted to be pushed downwardly.

In the cushion operating condition (B), as shown in FIG. 8, when the knockout transmission plate 65 is subjected to a load of a work reaction force (R), the pressure oil in the oil hydraulic actuation chamber 64 serves to open the valve body 30 in a large flow area so as to flow into the plunger chamber 3a quickly and serves to push and hold down the work plate 70 stably while allowing an upward movement of the knockout transmission plate 65 as a cushion operation thereof.

In the knockout operating condition (D), as shown in FIG. 9, when only the high pressure actuation chamber 9 of the pneumatic cylinder 2 is supplied with a pressure air so as to increase the pressure in the plunger chamber 3a and then the output portion 54 of the knockout actuator 28 is extended so as to open the valve body 30 in a small flow area, a small amount of a high pressure oil is supplied from the plunger chamber 3a to the oil hydraulic actuation chamber 64 so that the knockout transmission plate 65 serves to knock out the work plate 70 strongly at a low speed.

2. Background of the Prior Art

Figure 10:
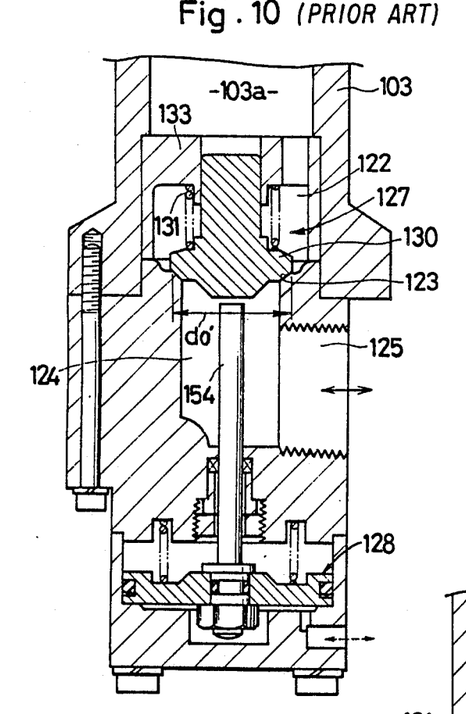
FIG. 10 is a view showing first conventional embodiment in correspondence to FIG. 1.
Figure 11:
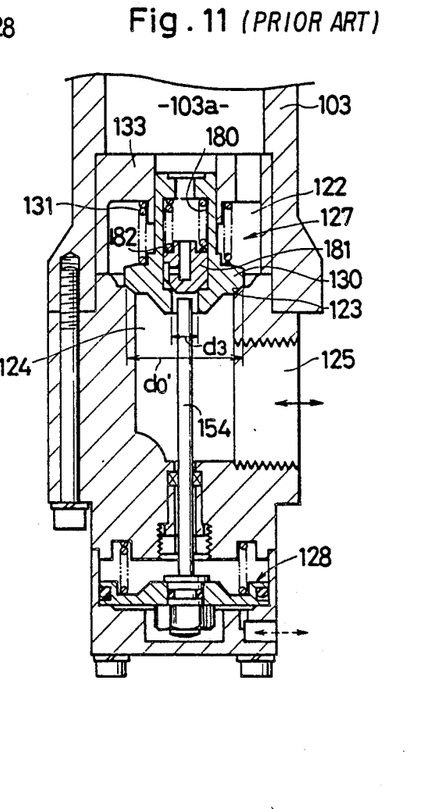
FIG. 11 is a view showing second conventional embodiment in correspondence to FIG. 1.

In the above-mentioned basic construction, the inventor of the present invention previously proposed the structure shown in FIG. 10 or in FIG. 11 (refer to Japanese Utility Model Provisional Publication No. 76348 of 1983) as a construction for the practical applications of the valve unit 27 and the knockout actuator 28.

In the first conventional embodiment, as shown in FIG. 10, the symbol 103 is an oil hydraulic cylinder, 103a is a plunger chamber, 124 is an outlet chamber, 125 is a pressure oil inlet outlet port, and 127 is a valve unit. There is provided a single valve body 130 in the valve chamber 122 and there is provided a valve closing spring 131 between the valve body 130 and the end wall 133 of the the valve chamber 122, opposed to the valve seat 123 so that the valve body 130 is pushed to the valve seat 123 by the resultant force of the resilient force of the valve closing spring 131 and the pressure in the valve chamber 122. The output portion 154 of the knockout actuator 128 is disposed oppositely to the valve body 130 so as to enable to push and open the valve body 130.

In the second conventional embodiment, as shown in FIG. 11, the above-mentioned first embodiment is improved as follows component parts having the same function are indicated by the same symbol as one shown in FIG. 10. That is, the valve body 130 is provided with a knockout oil supply hole 180 which connects the plunger chamber 103a to the outlet chamber 124 and has a knockout valve body 181 of a small diameter fitted therein 180. There is provided a valve closing spring 182 between the knockout oil supply hole 180 and the knockout valve body 181. The output portion 154 of the knockout actuator 128 is disposed oppositely to the knockout valve body 181 so as to push and open the valve body 181.

FIG. 11 may be compared to FIG. 7, in that each shows the respective valve body (30 in FIG. 7, 130 in FIG. 11) in a comparable seated position. As persons skilled in the art will appreciate, when protruding output portion 154 is moved upward by knockout activator 128, the former will lift knockout body 181. High pressure oil from chamber 103a will then flow downward through hole 180 in valve body 130, through knockout valve body 181, past the upper end of 154 and into outlet chamber 124.

There are, however, a number of disadvantages associated with the above-mentioned first conventional embodiment (refer to FIG. 10).

(1) The knockout actuator 128 becomes large in size.

During the knockout operation, the output portion 154 of the knockout actuator 128 is adapted to push and open the valve body 130 after increasing the pressures in the plunger chamber 103a and in the valve chamber 122 in advance.

Thereupon, since the valve body 130 is subjected to a large valve opening force in accordance with the large flow area defined by the diameter $d_0'$ of the valve seat by the pressure in the valve chamber 122, a large knockout actuation force is required and consequently the knockout actuator 128 should become large.

(2) The durability of the valve closing spring 131 suffers.

During the cushion operation and during the knockout operation, since the valve closing spring 131 is vibrated by the pressure oil flowing through the valve chamber 122, it gets fatigued and degraded in a short time.

On the other hand, the second conventional embodiment (refer to FIG. 11) has the advantage that (1) because the knockout actuator 128 can be made smaller in size due to the small knockout actuation force in accordance with the small flow area defined by the valve seat diameter $d_3$ of the knockout valve body 181. However, besides the above-mentioned disadvantage (2) still unsolved therein, moreover there are following disadvantages (3), (4) associated therewith.

(3) The construction of the valve unit 127 is complicated.

Since there are provided two valve bodies 130, 181 and two valve closing springs 131, 182 therein, the parts number gets increased and the construction gets more complicated.

(4) Pressurized oil tends to leak out.

Since the valve opens and closes at two locations, pressurized oil tends to leak out due to foreign substances caught therein.

SUMMARY OF THE INVENTION

Accordingly, it is an object of the present invention to make a knockout actuator smaller in size.

It is another object of the present invention to improve the durability of a valve closing spring.

It is still another object of the present invention to simplify the construction of a valve unit.

It is a further object of the present invention to prevent a leakage of pressurized oil which might be caused by foreign substances caught between a valve seat and a valve body.

In order to solve the above-mentioned problems, the present invention is characterized in that the valve unit and the knockout actuator are constructed as follows in the above-mentioned basic construction.

The valve unit is adapted to bias a single valve body to the valve seat, for closing the valve by the resultant force obtained from both the spring force of a valve closing spring and the pressure in the valve chamber, as well as to bias the valve body away from the valve seat by the pressure in a back pressure cylinder for opening the valve, a guide hole being provided at the end wall of the valve chamber, opposed to the valve seat so as to support and guide the valve stem of the valve body slidably thereby as well as to provide a valve closing spring between the guide hole and the valve body, said back pressure cylinder being disposed at the opposite side of the outlet chamber to the valve chamber so as to accommodate a back pressure piston connected to the valve body as well as to connect a back pressure cylinder chamber of the back pressure cylinder to the valve chamber, and the diameter of said back pressure piston being made smaller than the diameter of said valve seat, and the output portion of the knockout actuator being opposed to the back pressure piston so as to enable to push the piston toward the valve opening side.

According to the present invention, the following benefits are obtained:

(1) During the knockout operation the valve opening force can be small, which is obtained by adding the spring force of the valve closing spring to the differential force in accordance with the difference between both areas defined respectively by the diameter of the valve seat and the diameter of the back pressure piston. Therefore, the knockout actuator can be of a small output and can be made smaller in size.

(2) During the cushion operation and during the knockout operation, since the pressurized oil barely flows through the space wherein the valve closing spring is provided, the valve closing spring does not get fatigued by vibrations and the durability of the spring gets improved.

(3) Since each number of the valve body and the valve closing spring can be decreased to one, the number of the component parts is also decreased and the construction of the valve unit gets simplified.

(4) Since the locations where the valve opens and closes can be decreased from two to one, the probability of catching foreign substances is halved so as to cause much less oil leakage and to improve the reliability.

The foregoing and other objects and attendant effects of the present invention will be readily appreciated as the same become better understood by reference to the following detailed description when considered with the accompanying drawings.

BRIEF DESCRIPTION OF THE DRAWINGS

FIGS. 1 through 5 show the embodiments of the present invention;

FIGS. 1 through 4 show a preferred embodiment thereof;

FIGS. 6 through 9 are explanatory views of the basic technology to be premised for the present invention;

FIGS. 10 and 11 show conventional embodiments;

DESCRIPTION OF THE PREFERRED EMBODIMENT

The preferred embodiment of the present invention will now be described in detail with reference to FIGS. 1 through 4 hereinafter.

Note that, the component parts having the same functions as ones described in the above-mentioned basic technology (refer to FIGS. 6 through 9) for the present invention are indicated by the same symbols.

In FIG. 2, the symbol 1 is a pneumatic-hydraulic booster type driving device which includes a pneumatic-hydraulic booster 4 comprising a pneumatic cylinder 2 of a large diameter and a hydraulic cylinder 3 of a small diameter and which serves to generate a high hydraulic pressure by the pneumatic-hydraulic booster 4 which is supplied with a low pneumatic pressure. The supply and discharge of the high pressure oil in a cushion-knockout mechanism 62 of a slide 61 of a press-machine 60 is performed through a pressurized oil supply and discharge means 5 fixed to the left end of the pneumatic-hydraulic booster 4.

First of all, the pneumatic-hydraulic booster 4 will be explained. The pneumatic cylinder 2 is constructed in a double acting type. That is, a pneumatic piston 8 is fitted slidably in an air-tight manner into a cylinder body 7 of which axis is directed laterally. A high pressure actuation chamber 9 is formed at the right side of the piston 8 so as to be connected to a high pressure supply discharge port 12 through a connection pipe 11, and a low pressure actuation chamber 10 is formed at the left side 8 thereof so as to be connected to a low pressure supply discharge port 13.

Between the cylinder body 7 and the pressure oil supply and discharge means 5, the hydraulic cylinder 3 is fixedly secured by a plurality of tie-rods 15. In the plunger chamber 3a of the hydraulic cylinder 3, there is provided a plunger 17 slidably in an oil-tight manner, which is connected interlockingly to the piston 8.

A working oil tank 18 is fixedly mounted on the the cylinder body 7. The working oil preserved therein is adapted to be supplied to the plunger chamber 3a through a supply hole 19.

The pressure oil supply and discharge means 5 will now be explained. The plunger chamber 3a of the hydraulic cylinder 3 is connected to the pressurized oil inlet/outlet port 25 through a valve chamber 22, a valve seat 23 and an outlet chamber 24 which are arranged in order within a valve casing 21. The pressurized oil inlet/outlet port 25 is connected to the cushion cylinder 63 of the cushion-knockout mechanism 62 through a hydraulic line 26. There is provided a valve unit 27 in the valve chamber 22. The valve unit 27 is adapted to be opened in a large flow area by the cushion actuation pressure in the cushion cylinder 63 so that the cushion pressure oil is allowed to quickly flow into the plunger chamber 3a from the pressure oil inlet outlet port 25 and also to be opened in a small flow area by the knockout actuator 28 so that the knockout pressure oil is allowed to flow out from the plunger chamber 3a to the pressure oil inlet outlet port 25.

The valve unit 27 and the knockout actuator 28 are explained in detail with reference to FIGS. 1 and 3 and FIG. 4 hereinafter.

The valve unit 27 includes a single cylindrical valve body 30 and a valve closing spring 31 which serves to push the valve body 30 to the valve seat 23. A guide sleeve 32 is threadably mounted to the peripheral wall of the valve chamber 22 and has a through hole 34 and a guide hole 35 formed at the end wall thereof 32 opposed to the valve seat 23. The valve stem 36 of the valve body 30 is fitted into the guide hole 35 slidably so as to be guided thereby 35. The valve closing spring 31 is provided between both bottom walls of the guide hole 35 and of the cylindrical hole 37 of the valve body 30. The valve body 30 is adapted to be pushed to the valve seat 23 so as to close the valve by means of the resultant force obtained from the spring resilient force of the valve closing spring 31 and the pressure in the valve chamber 22.

On the other hand, at the opposite side of the outlet chamber 24 to the valve chamber 22, there is provided a back pressure cylinder 40 which serves to push the valve body 30 away from the valve seat 23 so as to open the valve. That is, a back pressure cylinder chamber 41 is formed at the left side of the valve casing 21 by reducing the diameter of the outlet chamber 24, and has a back pressure piston 42 fitted slidably therein 41. The back pressure piston 42 comprises a cylindrical piston body 43 fitted slidably in an oil-tight manner in the the back pressure cylinder chamber 41 and a piston rod 44 fitted slidably in the cylindrical hole 43a thereof 43. The piston rod 44 is connected to the valve body 30.

The back pressure cylinder chamber 41 is connected to the plunger chamber 3a and the valve chamber 22 through the through hole 44a of the piston rod 44 and the cylindrical hole 37 of the valve body 30 so that the piston body 43 pushes the valve body 30 toward the valve opening side by the pressure in the back pressure cylinder 40 through the shoulder portion 44b of the piston rod 44.

Figure 3:
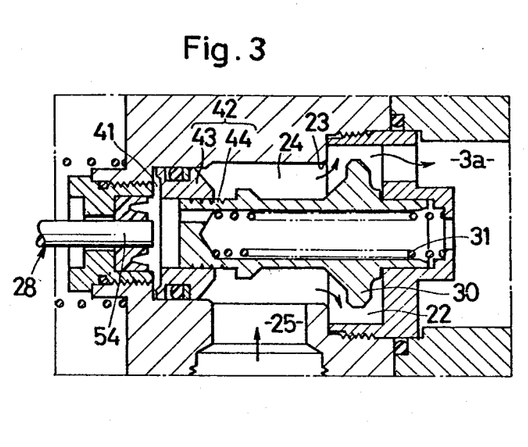
FIG. 3 is an explanatory view showing a cushion operating condition.

When the cushion actuation pressure is applied to the outlet chamber 24, the piston body 43 is left behind in the back pressure cylinder chamber 41 and only the piston rod 44 is moved together with the valve opening movement of the valve body 30 by the pressure in the outlet chamber 24 as shown in FIG. 3.

The knockout actuator 28 comprises a hydraulic actuating cylinder.

That is, a cylindrical knockout piston 47 is fitted slidably in an air-tight manner in the cylinder body 46 threadably connected to the left portion of the valve casing 21. At the left side of the piston 47, there is provided a hydraulic actuation chamber 48, and at the right side thereof 48, there is provided a spring chamber 49. The hydraulic actuation chamber 48 is connected to a supply discharge port 50 for a pressure air, and a stopper sleeve 51 is fitted in the spring chamber 49. An air-vent piston 52 is fitted movably in a reciprocating manner in the cylindrical hole 47a of the knockout piston 47. Between the right side shoulder 52a of the air-vent piston 52 and the valve casing 21, there is provided a return spring 53. From the air-vent piston 52, an output portion 54 thereof 28 is protruded toward the valve body 30. The output portion 54 is adapted to pass through the valve casing 21 slidably in an oil-tight manner and to be opposed to the piston rod 44 of the back pressure piston 42 so as to be able to push the valve body 30 toward the valve opening side through the piston rod 44.

By the changeover of the pressure in the hydraulic actuation chamber 48 into a predetermined knockout pressure, both pistons 47, 52 are extended over a knockout stroke (l) so that the output portion 54 opens the valve body 30 in a state of a small flow area through the piston rod 44 of the back pressure piston 42. On the other hand, by changing over the pressure in the hydraulic actuation chamber 48 into a predetermined air-vent pressure which is higher than that in the above-mentioned case, the air-vent piston 52 is further extended from the knockout piston 47 against the return spring 53 after the extensions of the both pistons 47, 52 so that the output portion 54 opens the valve body 30 in a state of a large flow area. The symbol 55 is an air-vent hole which is connected to the outlet chamber 24.

Figure 4:
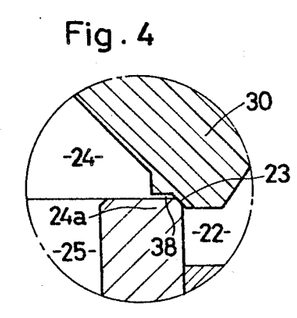
FIG. 4 is a partially enlarged view of FIG. 1.

As shown in FIG. 4, there is provided a throttling gap 38 directed laterally between the peripheral wall 24a of the outlet chamber 24 and the valve body 30 at the portion near the valve seat 23. When the output portion 54 of the knockout actuator 28 opens the valve body 30 in order to perform the knockout operation, the pressure oil in the plunger chamber 3a flows out to the pressure oil inlet outlet port 25 from the valve chamber 22 through the throttling gap 38. Accordingly, the cushion cylinder 63 of the press-machine 60 operates at a low speed so as to knock out a work plate 70 slowly.

Figure 5:
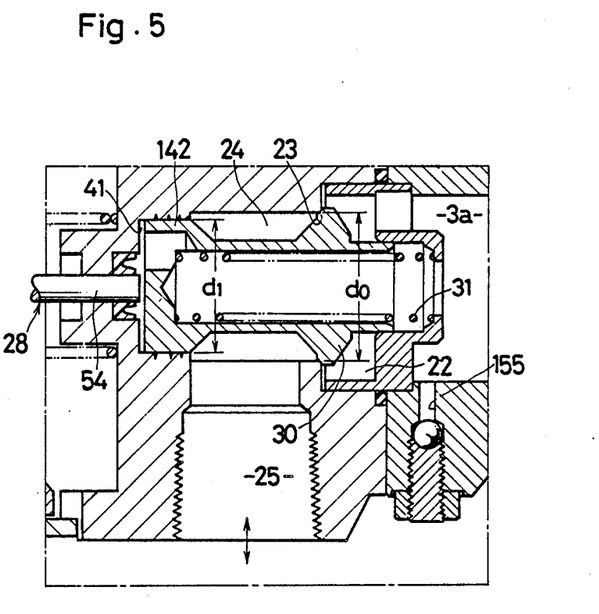
FIG. 5 is a view showing another embodiment thereof in correspondence to FIG. 1.

FIG. 5 shows another embodiment of the present invention. In this case, a single back pressure piston 142 is fitted in the back pressure cylinder chamber 41. And an air-vent hole 155 is connected to the plunger chamber 3a.

The functions of the present invention will now be explained with reference mainly to FIG. 1 and FIG. 3 hereinafter.

Figure 1:
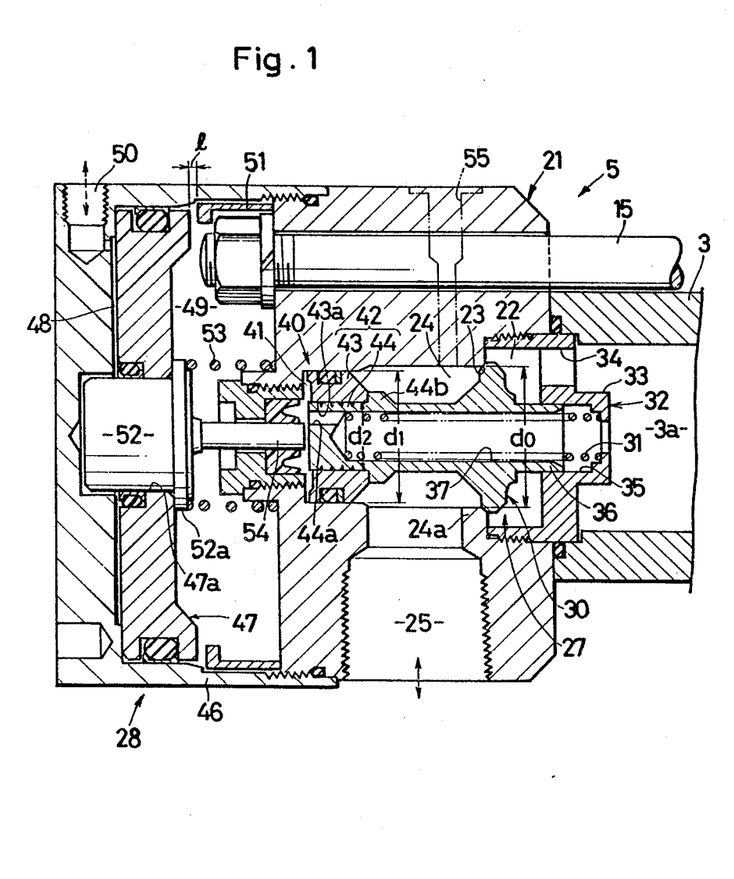
FIG. 1 is an enlarged view of a principal part in FIG. 2.

In the cushion pre-pressurizing condition shown in FIG. 1, the pressure in the valve chamber 22 is kept balanced with the pressure in the outlet chamber 24 and the valve body 30 is kept being pushed toward the valve closing side by the spring force of the valve closing spring 31.

When the cushion operation pressure is applied to the pressure oil inlet outlet port 25 from the cushion cylinder 63 (refer to FIG. 2) of the press-machine 60, the pressure in the outlet chamber 24 is increased and the valve opening force acts on the valve body 30 strongly in accordance with the difference between both areas defined respectively by the diameter ($d_o$) of the valve seat and the diameter ($d_2$) of the piston rod. This valve opening force overcomes the spring force of the valve closing spring 31 so as to open the valve body 30 in a state of a large flow area. At that time, since the cushin pressure oil quickly flows into the plunger chamber 3a through the peripheral portion of the valve chamber 22 from the pressure oil inlet outlet port 25 but barely flows into the space wherein the valve closing spring 31 is provided, the vibrations of the valve closing spring 31, which might be caused by the pressurized oil flows, are restrained effectively.

When the cushion operation is completed, the pressure in the valve chamber 22 gets balanced again with that in the outlet chamber 24, the valve body 30 is pushed to the valve closing side by the valve closing spring 31.

During the knockout operation, first of all the pressure in the plunger chamber 3a is increased to the knockout hydraulic pressure through the pneumatic-hydraulic booster 4. Thereupon, the hydraulic pressure is also applied to the back pressure cylinder chamber 41 so that the valve body 30 is pushed to the valve seat 23 by the valve closing force obtained by adding the spring force of the valve closing spring 31 to the differential pressure in accordance with the difference between both areas defined respectively by the diameter $d_o$ of the valve seat and the diameter $d_1$ of the back pressure piston. Then the valve body 30 is pushed toward the valve opening side so as to be opened a little by the operation of the knockout actuator 28 through the output portion 54 thereof. Thereupon, the knockout pressure oil flows out from the plunger chamber 3a to the pressure oil inlet outlet port 25 through the valve chamber 22 and the outlet chamber 24. In this case, the pushing force for opening the valve body 30 can be decreased to a small one which is obtained by adding the spring force of the valve closing spring 31 to the differential pressure in accordance with the difference between both areas defined respectively by the diameter $d_o$ of the valve seat and the diameter $d_1$ of the back pressure piston. Therefore, the knockout actuator 28 can be of small output and can be made smaller in size.

I claim:

1. A pneumatic-hydraulic booster type driving device for a cushion knockout mechanism associated with a slide of a press-machine that includes a cushion cylinder containing an oil under pressure, comprising:
   a pneumatic-hydraulic booster comprising a pneumatic cylinder of a first diameter and a pneumatic piston slidably fitted therein, said booster having a hydraulic cylinder of a second diameter smaller than said first diameter and a plunger that is connected to the piston and slidably fitted into said hydraulic cylinder, the hydraulic cylinder and the plunger cooperating to define a plunger chamber, said plunger chamber being connected in communication with a valve chamber, said valve chamber comprising a pressurized oil inlet/outlet port for flow of pressurized oil therethrough, a valve seat and an outlet chamber;

a valve unit having a valve seat formed therein and comprising a single movable valve body and a valve closing spring disposed to bias said movable single valve body toward said valve seat to form a valve thereby, said valve unit being in communication with said plunger chamber, said valve being closed under a resultant force including a spring force of said valve closing spring and a force due to oil pressure in said valve chamber, said valve unit being formed to also comprise a back pressure cylinder for receiving pressurized oil for opening said valve by biasing said valve body away from said valve seat;

said valve body being provided with a valve stem and and end wall of said valve chamber being provided with a guide hole opposed to said valve seat so as to support and slidably guide said valve stem of said valve body and to accommodate said valve closing spring between said guide hole and said valve body;

said back pressure cylinder being disposed at a side of the outlet chamber opposite to the valve chamber and in communication therewith, and comprising a back pressure piston connected to the valve body and slidably fitted in said back pressure cylinder to define a back pressure cylinder chamber therewith, wherein the diameter of said back pressure piston is smaller than the diameter of said valve seat; and a knockout actuator connected to said valve unit, said knockout actuator comprising a knockout piston and an air-vent piston both being coaxial and biased by a return spring, said knockout piston having a larger diameter than said air-vent piston, said air-vent piston having an elongate output portion extending from said knockout unit in an airtight manner to reach and exert a force on the valve body when said air-vent piston is moved due to a cushion actuating pressure of pressurized oil from said cushion cylinder of said press-machine, whereby a flow area available to flow of oil to or from said plunger chamber is controlled to be larger or smaller in response to said cushion actuating pressure, the output portion of said knockout actuator being opposed to said back pressure piston to be movable to push the same in a valve opening direction.

2. A pneumatic-hydraulic booster type driving device for the cushion-knockout mechanism associated with the slide of a press-machine as recited in claim 1, wherein:

said back pressure piston in said back pressure cylinder comprises a piston body slidably fitted in an oil-tight manner in said back pressure cylinder chamber and a piston rod fitted slidably into the piston body, said piston rod being connected to said valve body so that said piston body can push said valve body toward said valve opening direction when acted upon by a pressure in said back pressure cylinder through said piston rod, such that only said piston rod is moved with said valve-opening movement of said valve body by the cushion actuating pressure in the cushion cylinder of the press-machine while said piston body remains in said back pressure cylinder chamber.

3. A pneumatic-hydraulic booster type driving device for the cushion-knockout mechanism associated with the slide of a press-machine as recited in claim 1, wherein:

said valve body and a peripheral wall of said outlet chamber are formed to cooperate to provide a throttling gap disposed so that pressurized oil in said plunger chamber can flow out to said inlet/outlet port through said throttling gap when said valve body is actuated to a valve-opening position thereof by said knockout actuator.

4. A pneumatic-hydraulic booster type driving device for the cushion-knockout mechanism associated with the slide of a press-machine as recited in claim 1, wherein:

said knockout actuator comprising a hydraulic actuating cylinder, and a cylindrical knockout piston with a cylindrical hole therein, said knockout piston being slidably fitted in said hydraulic actuating cylinder so as to be movable reciprocatively within an extent of a predetermined knockout stroke and an air-vent piston provided so as to be movable reciprocatively in said cylindrical hole formed therefor in the knockout piston, said air-vent piston being provided with an output portion so that synchronous movement of both said knockout piston and said air-vent piston over said knockout stroke opens said valve body in a small flow area through said output portion, said knockout and air-vent pistons cooperating with said hydraulic activating cylinder to define a hydraulic pressure activating chamber such that when a pressure in said hydraulic pressure actuation chamber changes to a predetermined knockout pressure, and, in the alternative, said air-vent piston extends from said knockout piston after synchronous extensions of both of said pistons and said output portion opens said valve body in a large flow area by increasing the pressure in said hydraulic actuation chamber due to said change of pressure therein to a predetermined air-vent pressure.

5. A pneumatic-hydraulic booster type driving device for the cushion-knockout mechanism associated with the slide of a press-machine as recited in claim 1, wherein: said back pressure piston of said back pressure cylinder is formed integral with the valve body as a single element.

* * * * *